United States Patent
Loubet et al.

(10) Patent No.: US 7,906,381 B2
(45) Date of Patent: Mar. 15, 2011

(54) METHOD FOR INTEGRATING SILICON-ON-NOTHING DEVICES WITH STANDARD CMOS DEVICES

(75) Inventors: Nicolas Loubet, Grenoble (FR); Didier Dutartre, Meylan (FR); Stéphane Monfray, Grenoble (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 297 days.

(21) Appl. No.: 12/167,282

(22) Filed: Jul. 3, 2008

(65) Prior Publication Data

US 2009/0032874 A1 Feb. 5, 2009

(30) Foreign Application Priority Data

Jul. 5, 2007 (FR) ...................... 07 04870

(51) Int. Cl.
*H01L 21/84* (2006.01)
(52) U.S. Cl. ................. 438/164; 257/350; 257/E21.415; 257/E29.295
(58) Field of Classification Search .................. 438/164; 257/350, E21.415, E29.295
See application file for complete search history.

(56) References Cited

U.S. PATENT DOCUMENTS

| | | | |
|---|---|---|---|
| 5,894,152 | A | 4/1999 | Jaso et al. |
| 6,333,532 | B1 | 12/2001 | Davari et al. |
| 2003/0151112 | A1 | 8/2003 | Yamada et al. |
| 2005/0170604 | A1 | 8/2005 | Orlowski et al. |
| 2007/0138536 | A1 | 6/2007 | Arai et al. |

FOREIGN PATENT DOCUMENTS

| | | |
|---|---|---|
| FR | 2 812 764 A1 | 2/2002 |
| WO | WO 2007/014294 A2 | 2/2007 |

OTHER PUBLICATIONS

Yamada et al., "An Embedded DRAM Tehnology on SOI/Bulk Hybrid Substrate Formed with SEG Process for High-End SOC Application," 2002 Symposium on VLSI Technology Digest of Technical Papers, Honolulu, Jun. 11-13, 2002, Symposium on VLSI Technology, New York NY, IEEE, US, Jun. 11, 2002, pp. 112-113, XP001109841, ISBN: 0-7803-7312-X.
Skotnicki et al., "SON (Silicon On Nothing) Platform for ULSI Era: Technology & Devices," International Journal of High Speed Electronics and Systems, Mar. 2006, vol. 16 No. 1, pp. 137-146, XP009093131, © World Scientific Publishing Company.
International Preliminary Search Report dated Dec. 5, 2007 for FR 0704870.

*Primary Examiner* — Thao X Le
*Assistant Examiner* — Tanika Warrior
(74) *Attorney, Agent, or Firm* — Lisa K. Jorgenson; Stephen Bongini; Fleit Gibbons Gutman Bongini & Bianco P.L.

(57) ABSTRACT

A method is provided for fabricating transistors of first and second types in a single substrate. First and second active zones of the substrate are delimited by lateral isolation trench regions, and a portion of the second active zone is removed so that the second active zone is below the first active zone. First and second layers of semiconductor material are formed on the second active zone, so that the second layer is substantially in the same plane as the first active zone. Insulated gates are produced on the first active zone and the second layer. At least one isolation trench region is selectively removed, and the first layer is selectively removed so as to form a tunnel under the second layer. The tunnel is filled with a dielectric material to insulate the second layer from the second active zone of the substrate. Also provided is such an integrated circuit.

10 Claims, 3 Drawing Sheets

METHOD FOR INTEGRATING SILICON-ON-NOTHING DEVICES WITH STANDARD CMOS DEVICES

CROSS-REFERENCE TO RELATED APPLICATIONS

This application is based upon and claims priority from French Patent Application No. 07 04870, filed Jul. 5, 2007, the entire disclosure of which is herein incorporated by reference.

FIELD OF THE INVENTION

The present invention relates in general to the field of integrated semiconductor circuits, and more specifically to a method for integrating conventional "bulk" CMOS transistors with transistors having a thin conductive channel on insulator according to a silicon-on-nothing (SON) or localized silicon-on-insulator (SOI) structure.

BACKGROUND OF THE INVENTION

In the case of a conventional MOS transistor in "bulk" technology, the active zones are directly implanted in a mass ("bulk") of thick silicon forming the substrate. The presence of a thick substrate that is electrically continuous with the active superficial layers, however, induces parasitic phenomena therein, and makes them sensitive in particular to electrical disturbances (for example, leakage currents toward the substrate).

The special feature of transistors produced according to silicon-on-nothing (SON) technology, by comparison with the conventional "bulk" transistors, is the presence of a thin embedded dielectric layer, which insulates the conductive channel of the transistor from the substrate. The thickness of the thin film of silicon corresponding to the conductive channel of the transistor and of the insulating thin film is typically on the order of 5 to 25 nm. The benefit of such a structure is based in particular on better control of parasitic effects.

The SON technology also makes it possible to produce transistors with dynamic properties that are superior to those of the conventional CMOS technology, in addition to having other clear advantages such as lower consumption.

The advantages of this technology make it particularly suitable for uses in the fields of portable electronic apparatuses and wireless communication devices, which require components with increased performance in terms of speed and low consumption.

There is a need for circuits that are capable of simultaneously integrating components whose functions involves electrical properties specific to "bulk" devices, and components performing faster functions and thus involving electrical properties specific to SON or localized silicon-on-insulator (SOI) devices. Therefore, there is a need to integrate these two types of devices on a single substrate.

SUMMARY OF THE INVENTION

One embodiment of the present invention provides a method for fabricating transistors of first and second types in a single substrate. According to the method, at least one first active zone and at least one second active zone of the substrate are delimited by lateral isolation trench regions, and an upper portion of the second active zone is removed so that an upper surface of the second active zone is below an upper surface of the first active zone. After removing the upper portion of the second active zone, first and second layers of semiconductor material are formed on the second active zone, so that an upper surface of the second layer is substantially in the same plane as the upper surface of the first active zone. The first layer is constituted by a first material that is selectively removable with respect to a second material constituting the second active zone and with respect to a third material constituting the second layer. A first insulated gate is produced on the first active zone and a second insulated gate is produced on the second layer. At least one of the isolation trench regions is selectively removed so as to allow access to the first layer, and the first layer is selectively removed so as to form a tunnel under the second layer. The tunnel is filled with a dielectric material so as to insulate the second layer from the second active zone of the substrate.

Another embodiment of the present invention provides an integrated circuit including transistors of first and second types in a single substrate. The integrated circuit includes a first active zone of the substrate and a second active zone of the substrate delimited by lateral isolation trench regions, a first layer of dielectric material located on the second active zone, and a second layer of semiconductor material located on the first layer. An upper surface of the second active zone is below an upper surface of the first active zone, and an upper surface of the second layer is substantially in the same plane as the upper surface of the first active zone. The integrated circuit further includes a first insulated gate on the first active zone, a second insulated gate on the second layer, first source and drain regions in the first active zone, and second source and drain regions in the second layer. The dielectric material of the first layer insulates the second layer from the second active zone of the substrate, and the second active zone and the second layer are formed by one or more materials that are selectively removable with respect to another material.

BRIEF DESCRIPTION OF THE DRAWINGS

Other features and advantages of the present invention will become clearer on reading the following description of an illustrative and non-limiting example in reference to the appended figures, in which.

DETAILED DESCRIPTION OF PREFERRED EMBODIMENTS

Figure 1:
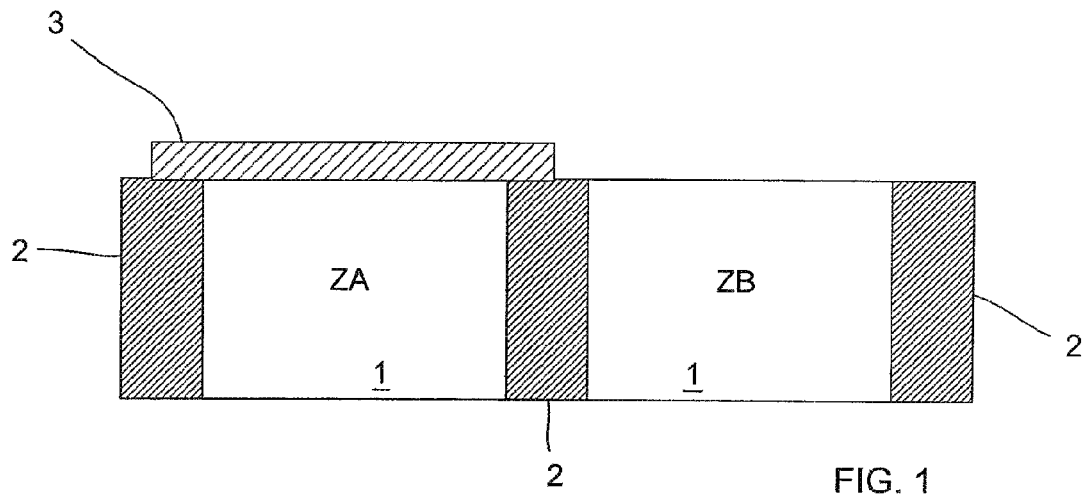
FIGS. 1 to 8 diagrammatically show steps of a fabrication method according to an embodiment of the present invention, and FIG. 9 diagrammatically shows an integrated circuit that includes a conventional MOS transistor and an SON transistor in accordance with an embodiment of the present invention.

Preferred embodiments of the present invention will be described in detail hereinbelow with reference to the attached drawings.

Preferred embodiments of the present invention provide a method for fabricating transistors of first and second types in a single substrate. At least one first active zone and at least one second active zone of the substrate are delimited by lateral isolation trench regions, and an upper portion of the second active zone is removed so that an upper surface of the second active zone is below an upper surface of the first active zone. After removing the upper portion of the second active zone, first and second layers of semiconductor material are formed on the second active zone, so that an upper surface of the second layer is substantially in the same plane as the upper surface of the first active zone. The first layer is constituted by a first material that is selectively removable with respect to a second material constituting the second active zone and with respect to a third material constituting the second layer. A first insulated gate is produced on the first active zone and a second insulated gate is produced on the second layer. At least one of the isolation trench regions is selectively removed so as to allow access to the first layer, and the first layer is selectively removed so as to form a tunnel under the second layer. The tunnel is filled with a dielectric material so as to insulate the second layer from the second active zone of the substrate.

In one embodiment, the removing of the upper portion of the second active zone includes masking the first active zone, and then selectively etching the upper portion of the second active zone.

In some embodiments, the second material is the same as the third material.

Preferably, the first material comprises a silicon-germanium alloy and is formed by epitaxy from the upper surface of the second active zone, and the third material is a silicon layer and is formed by epitaxy from an upper surface of the first layer.

In some embodiments, first spacers are produced that surround the first insulated gate, second spacers are produced that surround the second insulated, and there is performed selective epitaxy from the second layer so as to over-thicken the second layer on each side of the second spacers that surround the second insulated gate.

Preferably, source and drain regions are produced in the first active zone and in the second layer.

Further embodiments of the present invention provide an integrated circuit including transistors of first and second types in a single substrate. The integrated circuit includes a first active zone of the substrate and a second active zone of the substrate delimited by lateral isolation trench regions, a first layer of dielectric material located on the second active zone, and a second layer of semiconductor material located on the first layer. An upper surface of the second active zone is below an upper surface of the first active zone, and an upper surface of the second layer is substantially in the same plane as the upper surface of the first active zone. The integrated circuit further includes a first insulated gate on the first active zone, a second insulated gate on the second layer, first source and drain regions in the first active zone, and second source and drain regions in the second layer. The dielectric material of the first layer insulates the second layer from the second active zone of the substrate, and the second active zone and the second layer are formed by one or more materials that are selectively removable with respect to another material.

In one embodiment, first spacers surround the first insulated gate, second spacers surround the second insulated, and the second layer is over-thickened on each side of the second spacers that surround the second insulated gate.

Preferably, the second layer is a silicon layer, and the second active zone is constituted by silicon.

In some embodiments, the second layer is a silicon layer having a thickness of between about 10 and 20 nm.

The steps of a fabrication method according to an embodiment of the present invention will now be described in greater detail with reference to FIGS. 1 to 9.

FIG. 1 shows a semiconductor substrate 1, for example silicon, comprising a first active zone ZA and a second active zone ZB, laterally delimited by lateral isolation regions 2, which can be isolation trenches. These isolation trenches can, for example, be the shallow STI type (Shallow Trench Isolation) or the deep DTI type (Deep Trench Isolation).

The first active zone ZA, called the "bulk" zone, is intended to receive a conventional CMOS device, while the second active zone ZB, called the "SON" zone, is intended to receive a device with silicon-on-nothing (SON) architecture. At this point, the first active zone ZA is masked. This is performed in a conventional manner by forming a layer 3 by oxidation (for example, of silicon dioxide). This layer 3 covers the substrate and will subsequently be used to form a mask for the first active zone ZA. To do this, the deposition of the layer 3 is followed by a photoactive layer aligned with the first active zone ZA and an etching of the oxide layer. This frees the second active zone ZB, where a SON, or localized silicon-on-insulator (SOI), transistor will be formed, whereas the first active zone ZA, where a "bulk" transistor is to be formed, remains masked.

Figure 2:
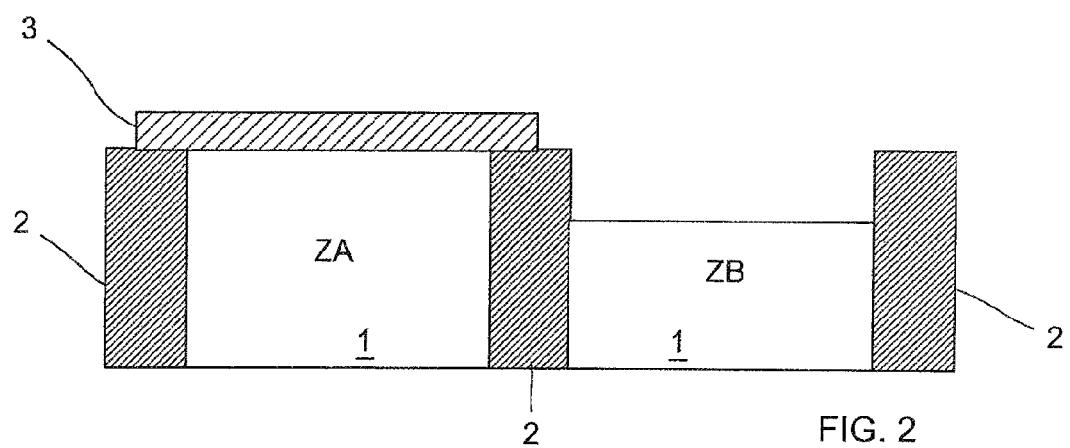

An upper layer of the second active zone ZB is then removed by etching, as shown in FIG. 2, so as to lower the level of the second active zone ZB with respect to the level of the first active zone ZA. This etching of a portion of the silicon of the second active zone ZB is performed in a known manner, for example by selective isotropic plasma etching or by selective chemical etching.

Figure 3:
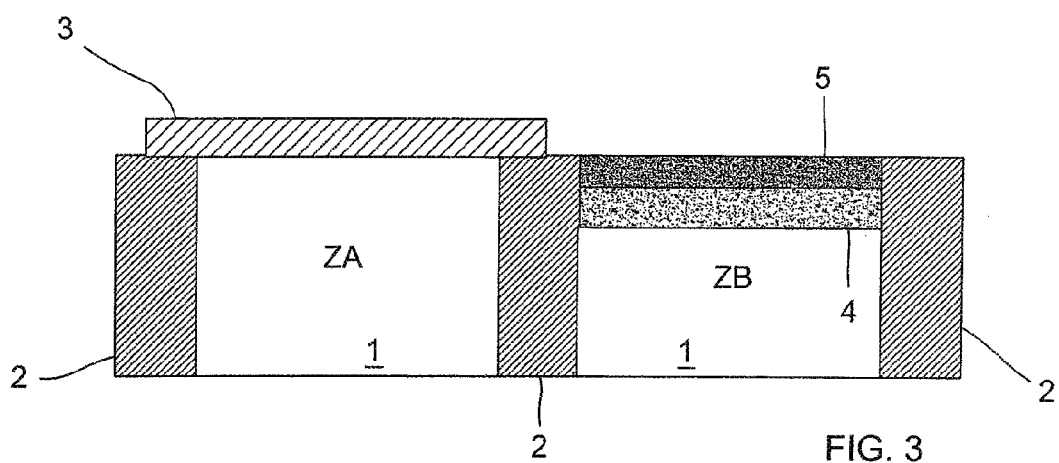

This lowering of the active zone ZB is adjusted according to the thickness of the stack of layers that will subsequently be formed on it, as explained in greater detail below with reference to FIG. 3.

In a next step, a first layer 4, preferably made of a silicon-germanium alloy, is produced by selective epitaxy on the lowered active zone ZB, which layer will be used as explained below for the future embedded oxide. A second layer 5, preferably made of silicon, is then produced by selective epitaxy on the first layer 4, in order to form the future conductive channel and the source and drain regions of the transistor.

The material forming the layer 4 is more generally a material that can be selectively removed from the silicon, and that preferably ensures lattice continuity with the silicon during the epitaxy. Silicon-germanium alloys advantageously have these properties and are easily selectively removable, in a known manner, for example using oxidizing chemistry or an isotropic plasma attack. For example, for the layer 4, in one embodiment a multi-crystalline layer of silicon-germanium with 30% germanium is chosen, providing a good compromise of etching selectivity with crystalline quality.

The respective thicknesses of layer 4 and layer 5 are preferably between around 10 and 20 nm. Thus, in consideration of the desired thickness of the bi-layer 4 and 5 produced on the second active zone ZB, the lowering of this zone in the previous step must be such that the upper surface of the bi-layer 4 and 5 is substantially in the same plane as the upper surface of the first active zone ZA, which is still masked at this stage in the process.

Figure 4:
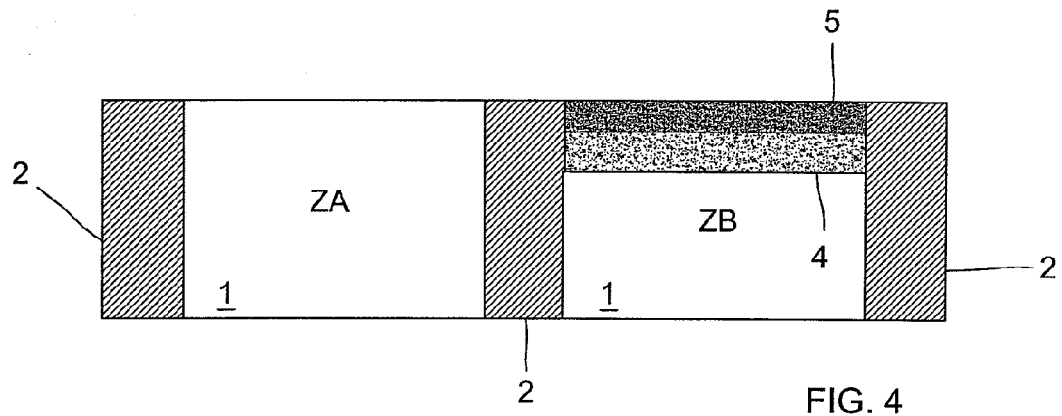

The oxide layer 3 masking the first active zone ZA is then removed, in a conventional and known manner, as shown in FIG. 4.

Figure 5:
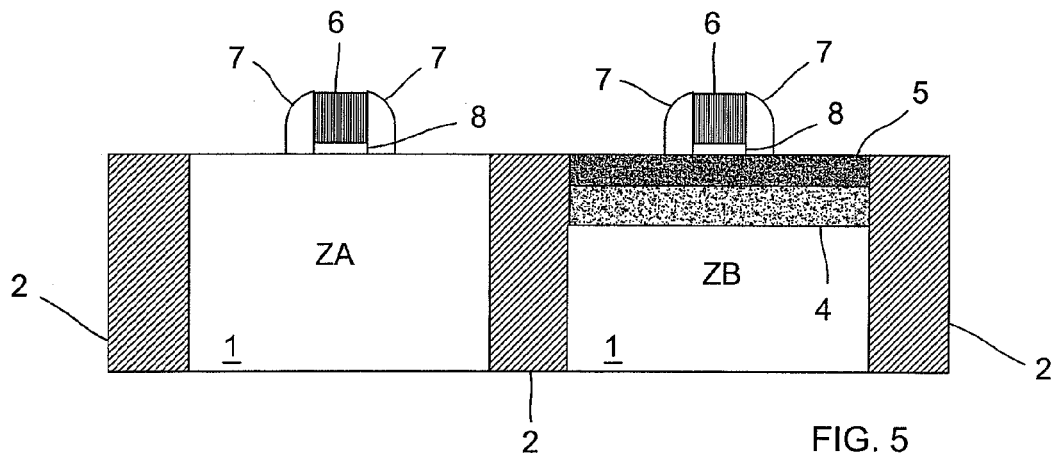

Then, as shown in FIG. 5, a gate region 6 is simultaneously produced on the first active zone ZA and on the layer 5 of the bi-layer superimposed on the second active zone ZB. This gate region can be made of polysilicon in a known manner, and is conventionally surrounded by spacers 7 and is separated from the layer immediately below by a silicon oxide layer (gate oxide).

The insulated gate 6 thus forms a bridge transversally overlapping the active zone of substrate ZA (and ZB, respectively), and resting on both sides of the zone ZA (and ZB, respectively) on the lateral isolation region 2.

Figure 6:
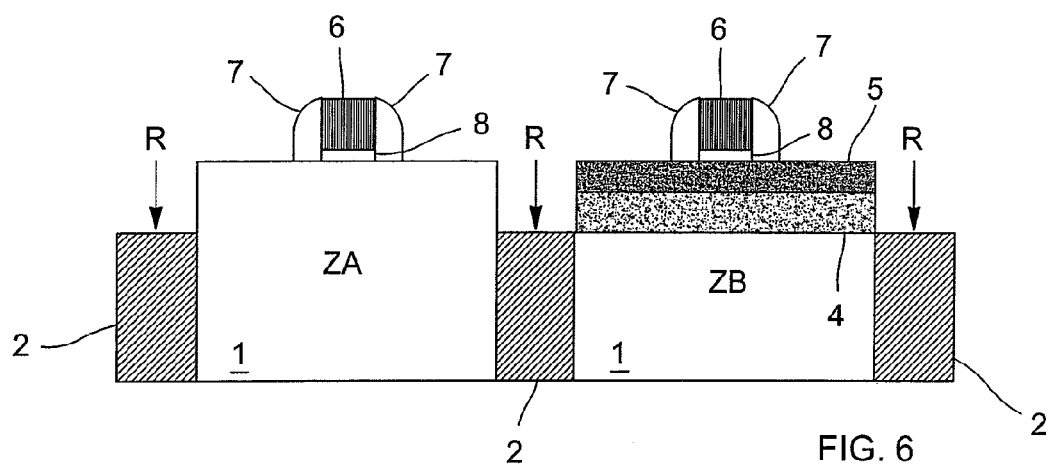

The next step is a selective etching, performed in a conventional manner as shown with arrows R in FIG. 6 (for example by an anisotropic plasma attack), of the isolation trenches 2, until lateral access to the layer 4 of selectively removable material of the bi-layer superimposed on the second active zone ZB is achieved. The gate region 6 and the spacers 7 are used as masks in this step of removal of the isolation trenches 2.

Figure 7:
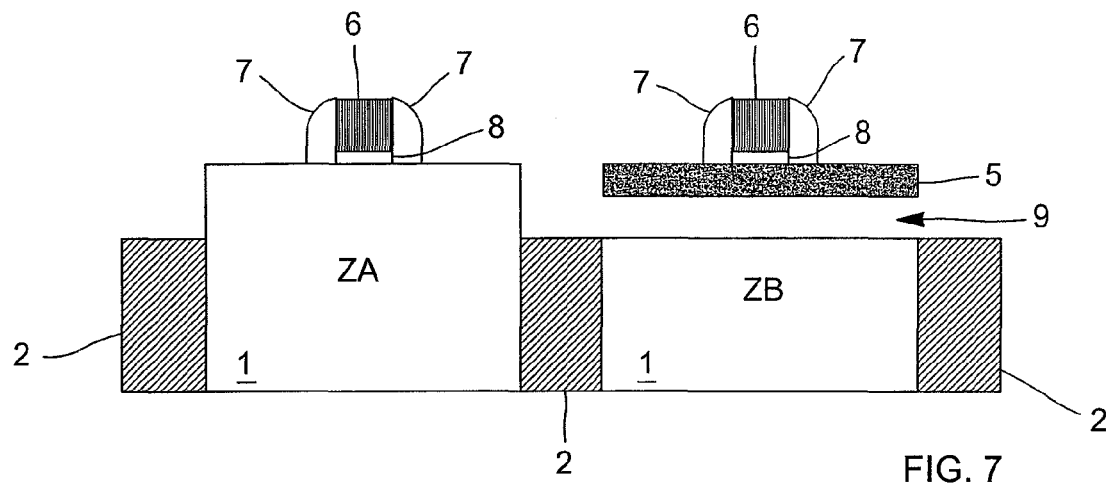

The silicon-germanium layer 4 is then removed, as shown in FIG. 7, for example using oxidizing chemistry or a selective isotropic plasma attack, so as to create a tunnel 9 between the silicon layer 5 and the surface of the second active zone ZB. The layer 5 is then held only by the gate, the ends of which rest on the isolation trenches.

According to an alternative embodiment, before the removal of the silicon-germanium layer 4, and in order to guarantee better mechanical strength, semiconductor zones are formed by selective epitaxy from the silicon layer 5, on each side of the spacers 7, so as to over-thicken the silicon layer. The source and drain regions will subsequently be formed at the level of these over-thickened zones by implantation of doping agents.

Figure 8:
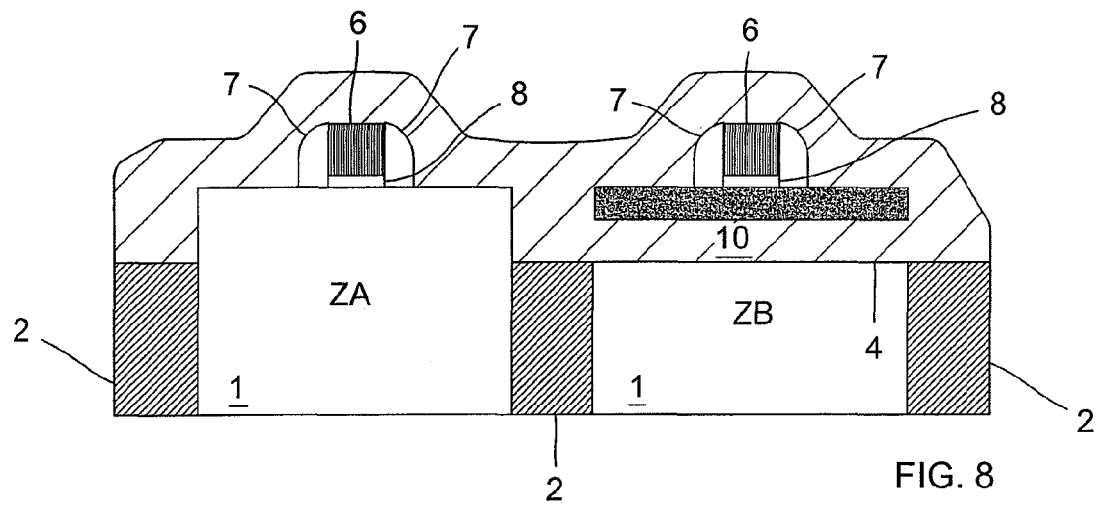

Then, a layer 10 of a dielectric material (for example, $SiO_2$, $Si_3N_4$, or the like) is deposited in order to fill the tunnel 9, as shown in FIG. 8. The excess of the dielectric layer is etched in a known manner, for example by anisotropic etching, so as to preserve the dielectric layer 10 only under the silicon layer 5, on the side of the active zone ZB intended to receive the SON devices.

The embedded dielectric layer 10 makes it possible to totally insulate the transistor which will be formed for the second active zone ZB of the substrate.

Then, subsequent steps conventionally produce transistors respectively at the level of the first active zone ZA and the second active zone ZB. These subsequent steps in particular implant doping agents on each side of the spacers 7, respectively on the first active zone ZA and on the silicon layer 5 (optionally over-thickened according to the alternative embodiment described above), in order to form source and drain regions.

Figure 9:
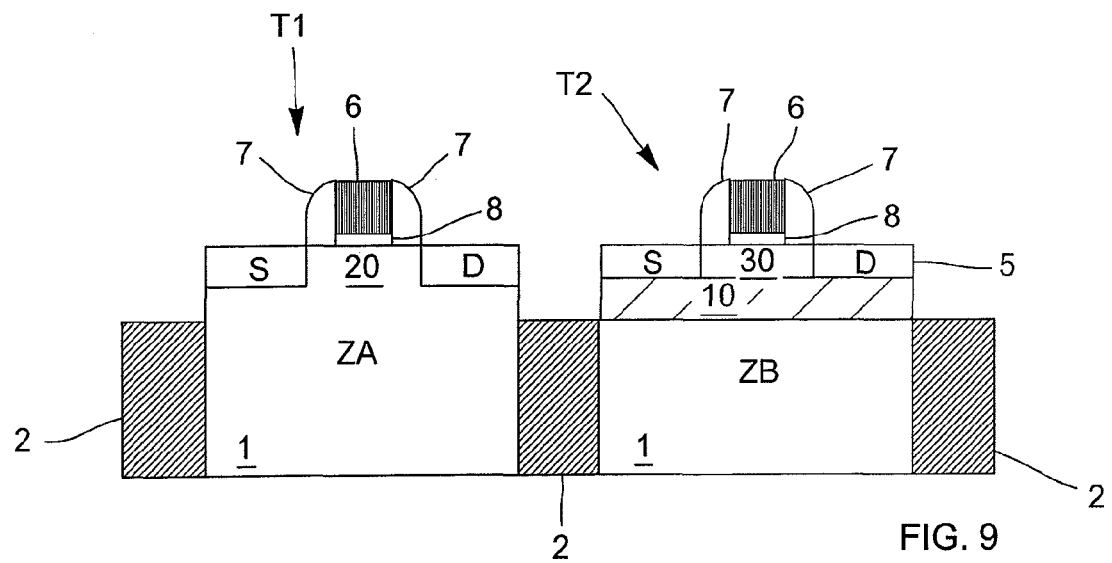

FIG. 9 shows an integrated circuit including a first conventional MOS transistor T1, produced with Si-bulk technology on the first active zone ZA, comprising a conductive channel 20 insulated from the gate 6 by the gate oxide layer 8 and on each side of which, the source S and drain D regions are formed.

The integrated circuit also includes a second SON transistor T2, produced on the second active zone ZB, including a fine conductive channel 30 formed in the silicon layer 5 and extending between the gate oxide 8 and the embedded dielectric layer 10. In addition, the source S and drain D regions are formed in the silicon layer 5 on each side of the channel 30 and are also vertically insulated from the second active zone ZB of the substrate by the dielectric layer 10.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for fabricating transistors of first and second types in a single substrate, the method comprising:
    delimiting at least one first active zone and at least one second active zone of the substrate by lateral isolation trench regions;
    removing an upper portion of the second active zone so that an upper surface of the second active zone is below an upper surface of the first active zone;
    after removing the upper portion of the second active zone, forming first and second layers of semiconductor material on the second active zone, so that an upper surface of the second layer is substantially in the same plane as the upper surface of the first active zone, the first layer being constituted by a first material that is selectively removable with respect to a second material constituting the second active zone and with respect to a third material constituting the second layer;
    producing a first insulated gate on the first active zone and a second insulated gate on the second layer;
    selectively removing at least one of the isolation trench regions so as to allow access to the first layer;
    selectively removing the first layer so as to form a tunnel under the second layer; and
    filling the tunnel with a dielectric material so as to insulate the second layer from the second active zone of the substrate.

2. The method according to claim 1, wherein the removing of the upper portion of the second active zone comprises:
    masking the first active zone; and
    after masking the first active zone, selectively etching the upper portion of the second active zone.

3. The method according to claim 2,
    wherein the first material comprises a silicon-germanium alloy and is formed by epitaxy from the upper surface of the second active zone, and
    the third material is a silicon layer and is formed by epitaxy from an upper surface of the first layer.

4. The method according to claim 3, further comprising:
    producing first spacers that surround the first insulated gate and second spacers that surround the second insulated gate; and
    before selectively removing the first layer so as to form a tunnel, performing selective epitaxy from the second layer so as to over-thicken the second layer on each side of the second spacers that surround the second insulated gate.

5. The method according to claim 4, further comprising producing source and drain regions in the first active zone and in the second layer.

6. The method according to claim 1, wherein the first material comprises a silicon-germanium alloy and the third material is a silicon layer.

7. The method according to claim 6, wherein the second material is a silicon layer.

8. The method according to claim 1, further comprising:
    producing spacers that surround the second insulated gate; and
    before selectively removing the first layer so as to form a tunnel, performing selective epitaxy from the second layer so as to over-thicken the second layer on each side of the spacers.

9. The method according to claim 1, further comprising producing source and drain regions in the first active zone and in the second layer.

10. The method according to claim 1, wherein the second material is the same as the third material.

* * * * *